United States Patent [19]

Okumura et al.

[11] Patent Number: 5,466,968

[45] Date of Patent: Nov. 14, 1995

[54] LEADFRAME FOR MAKING SEMICONDUCTOR DEVICES

[75] Inventors: Hiroshi Okumura; Atsuhito Negoro, both of Kyoto, Japan

[73] Assignee: Rohm Co. Ltd., Kyoto, Japan

[21] Appl. No.: 327,835

[22] Filed: Nov. 1, 1994

[30] Foreign Application Priority Data

Nov. 2, 1993 [JP] Japan .................................. 5-274117

[51] Int. Cl.⁶ .......................... H01L 23/48; H01L 29/44; H01L 29/52
[52] U.S. Cl. .......................... 257/693; 257/695; 257/773
[58] Field of Search .................................. 257/666, 692, 257/693, 694, 695, 773

[56] References Cited

U.S. PATENT DOCUMENTS 5,245,214  9/1993  Simpson .................................. 257/692

FOREIGN PATENT DOCUMENTS

| | | | |
|---|---|---|---|
| 60-121747 | 6/1985 | Japan | H01L 23/48 |
| 2-246126 | 10/1990 | Japan | 257/692 |
| 4-164357 | 6/1992 | Japan | 257/666 |
| 4-333276 | 11/1992 | Japan | 257/695 |

Primary Examiner—Jerome Jackson
Assistant Examiner—Donald L. Monin, Jr.
Attorney, Agent, or Firm—Michael D. Bednarek

[57] ABSTRACT

A leadframe is provided for making semiconductor devices. The leadframe comprises at least one island arranged centrally widthwise of the leadframe and having four corner portions, four bridging legs radially extending from the respective corner portions of the island, the bridging legs being integral with the leadframe and island; and a multiplicity of leads radially extending toward but spaced from the island, the leads being integral with the leadframe. The leads have respective tips which are progressively closer to the island toward the respective bridging legs.

2 Claims, 4 Drawing Sheets

LEADFRAME FOR MAKING SEMICONDUCTOR DEVICES

BACKGROUND OF THE INVENTION

1. Field of the Invention

This invention relates to a leadframe for making semiconductor devices of the type which comprises a multiplicity of leads extending out from all sides of a resin package. The present invention also relates to a semiconductor device which is rode by using such a leadframe.

2. Description of the Related Art

A leadframe of the above-described type is known from Japanese Patent Application Mid-open No. 60(1985)-121747. For the convenience of description, reference is now made to FIGS. 3 and 4 of the accompanying drawings which show a typical example of such leadframe.

As shown in FIGS. 3 and 4, there is shown only a region of a prior art leadframe 1 corresponding to a single semiconductor device. However, the leadframe 1 actually has a sufficient length for making a plurality of such semiconductor devices.

The leadframe 1 has a square island 2 generally at the widthwise center of the leadframe. The leadframe 1 further comprises four integral bridging legs 3a–3d extending radially inward for integral connection to the respective four corners of the island 2, and a multiplicity of integral leads 4 extending radially inwardly toward but spaced from the island 2 between the respective bridging legs 3a–3d.

The island 2 is used for bonding a semiconductor chip 5 which has a multiplicity of connection pads (electrode pads) electrically connected to the resepctive leads 4 through metal wires 6. The semiconductor chip 5 together with the leads 4 and wires 6 is enclosed in a molded resin package 7. This package may be formed by using a mold which has a gate 8 located at one corner of the mold cavity for injecting a fluid resin material, as indicated by arrow A in FIG. 3.

According to the prior art arrangement described above, the leads 4 between the respective bridging legs 3a–3d have their respective tips arranged on a line which is parallel to a corresponding side of the island 2 or semiconductor chip 5. Thus, in order to increase the number of leads while providing a predetermined pitch between the leads (as required for enabling wire bonding while preventing shorting therebetween), it is necessary to increase the spacing S (see FIG. 4) between the tip of each lead and the corresponding side of the chip 5. As a result, the wires 6 close to each bridging leg 3a–3d on both thereof must be inevitably rendered long.

On the other hand, it has been found that the wires 6 close to the bridging leg 3a where the gate 8 is formed are more influenced by a force component of the fluid resin injection pressure transverse to these wires than the other wires at the time of molding the resin package 7. Thus, if the wires 6 close to the bridging leg 3a are long, it is feared that they may be forcibly curved into shorting contact with the neighboring leads under the pressure of the injected resin fluid, thereby resulting in an unacceptable product quality.

SUMMARY OF THE INVENTION

It is, therefore, an object of the present invention to provide a semiconductor making leadframe which is capable of preventing unexpected shorting between the leads as well as between the wires even if the number of leads is increased.

Another object of the present invention is to provide a semiconductor device rode by using such a leadframe.

According to one apsect of the present invention, there is provided a leadframe for making semiconductor devices comprising: at least one island arranged centrally widthwise of the leadframe and having four corner portions; four bridging legs radially extending from the respective corner portions of the island, the bridging legs being integral with the leadframe and island; and a multiplicity of leads radially extending toward but spaced from the island, the leads being integral with the leadframe; wherein the leads have respective tips which are progessively closer to the island toward the respective bridging legs.

In a preferred embodiment, the respective tips of the leads located between each bridging leg and a middle point of each two adjacent bridging legs are arranged on a straight line which is inclined relative to a corresponding side of the island. The straight line my be advantageously inclined relative to the the corresponding side of the island by 45 degrees.

According to another aspect of the present invention, there is provided a semiconductor device comprising: a central island having four corner portions; a semiconductor chip mounted on the island, the chip having connection points arranged along respective edges of the chip; four bridging legs radially extending integrally from the respective corner portions of the island; a multiplicity of leads radially extending toward but spaced from the island, the leads having respective tips electrically connected to the respective connection points of the semiconductor chip through respective wires; and a resin package enclosing the island, semiconductor chip, bridging legs, leads and wires; wherein the wires are progessively shorter toward the respective bridging legs.

Other objects, features and advantages of the present invention will become apparent from the following detailed description of the preferred embodiment given with reference to the accompanying drawings.

DETAILED DESCRIPTION OF THE PREFERRED EMBODIMENT

Figure 1:
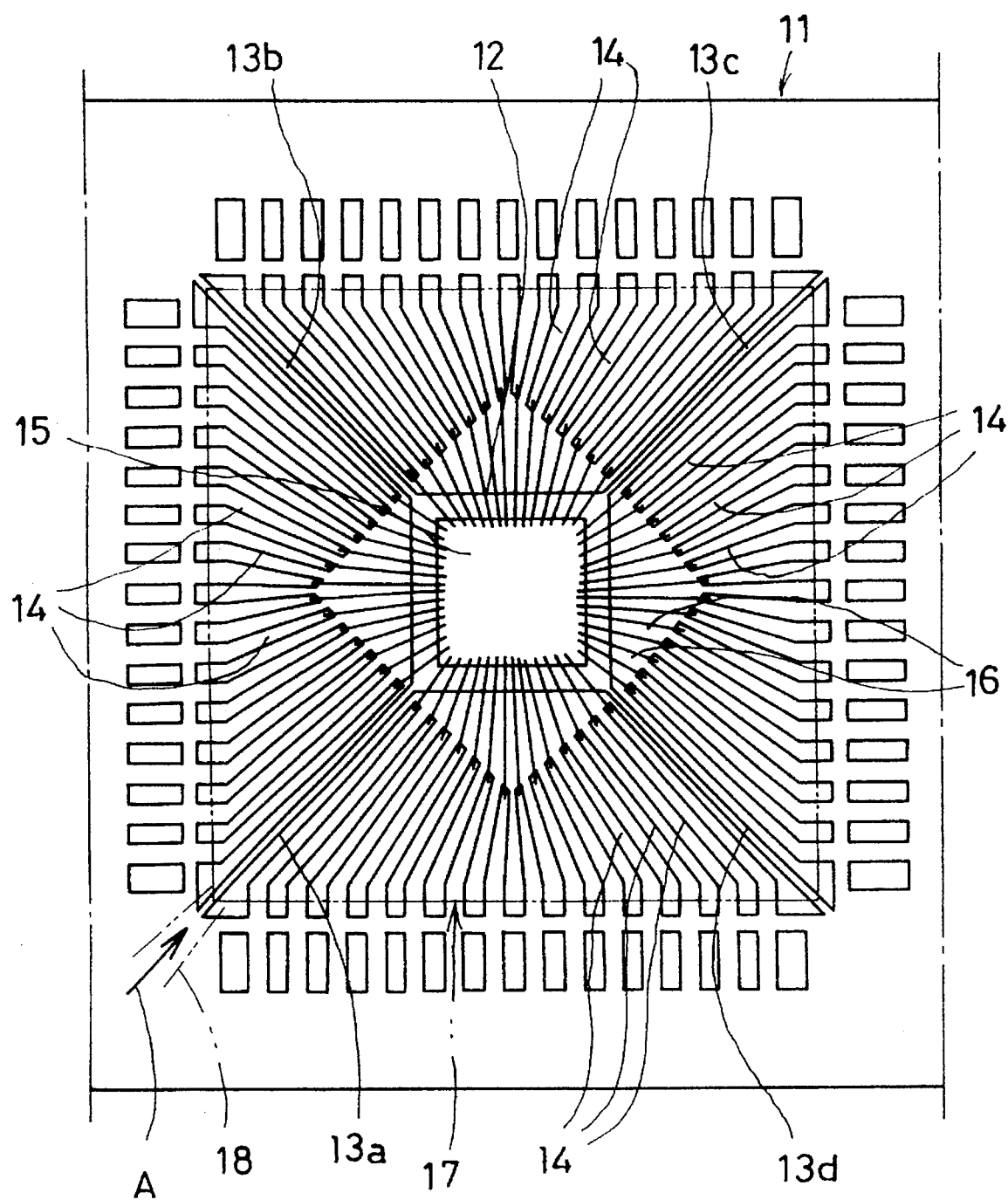
FIG. 1 is a fragmentary plan view showing a leadframe according to an embodiment of the present invention.
Figure 2:
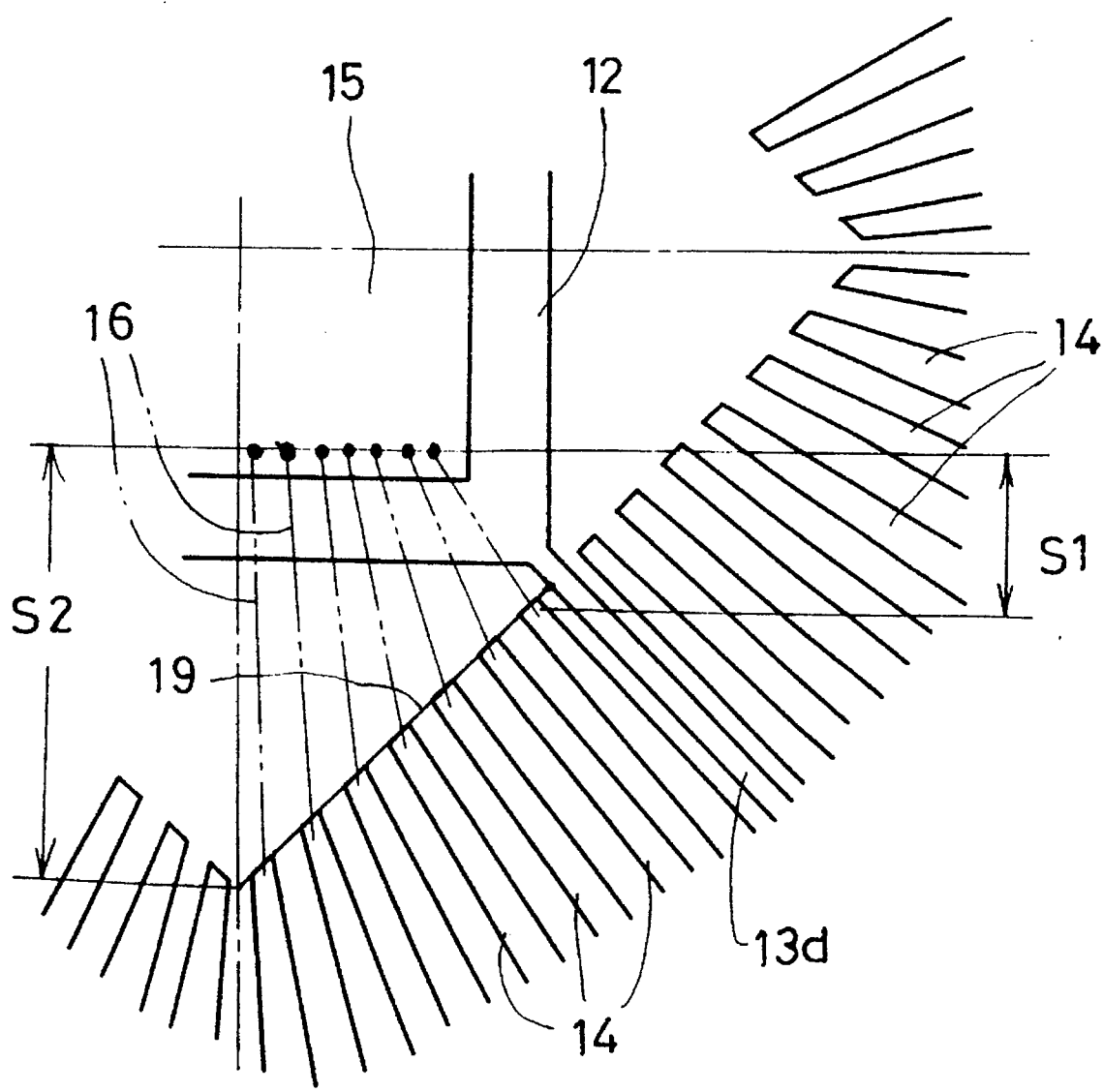
FIG. 2 is an enlarged fragmenary plan view showing a principal portion of the same leadframe.
Figure 3:
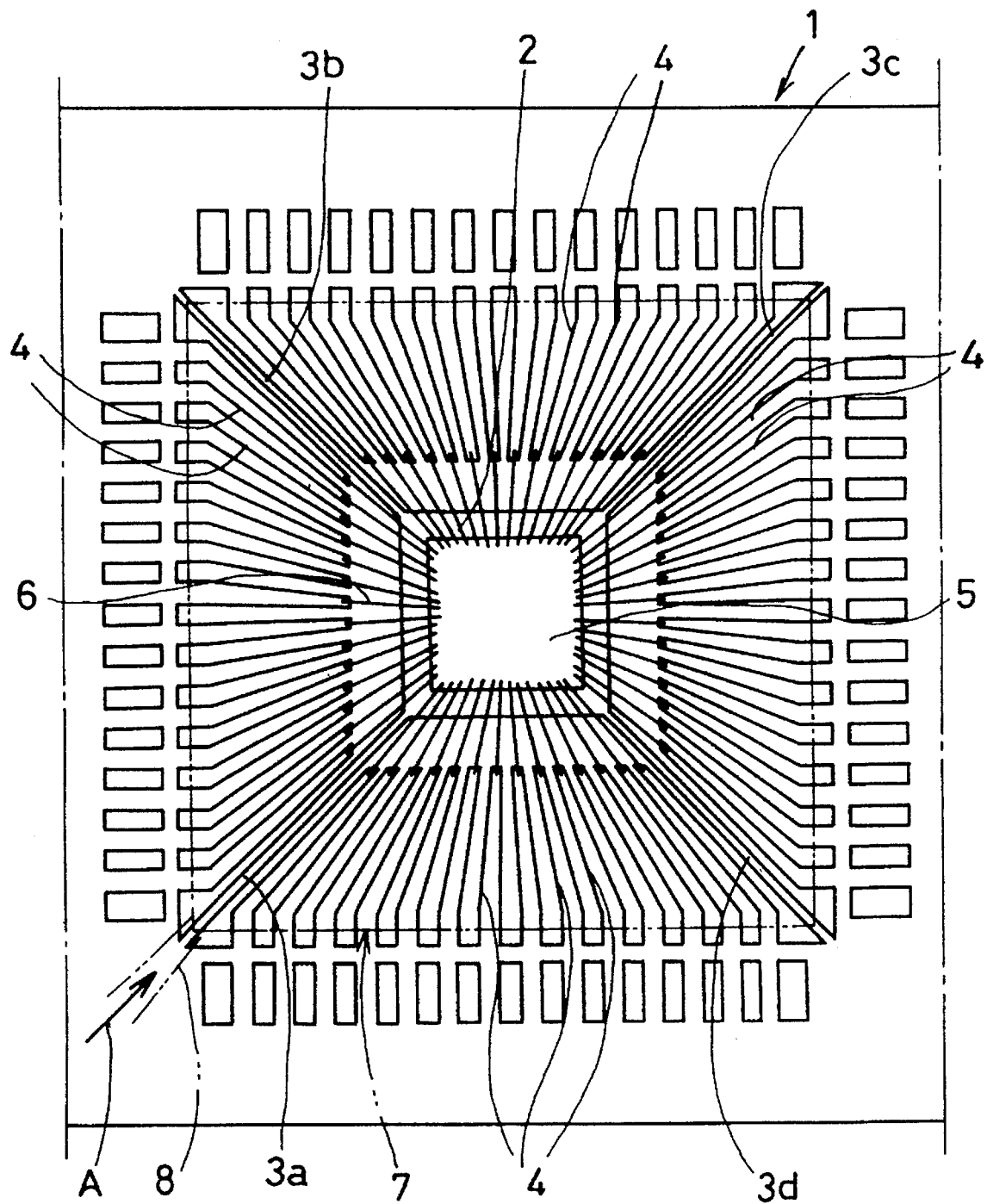
FIG. 3 is a fragmenary plan view showing a typical prior art leadframe.
Figure 4:
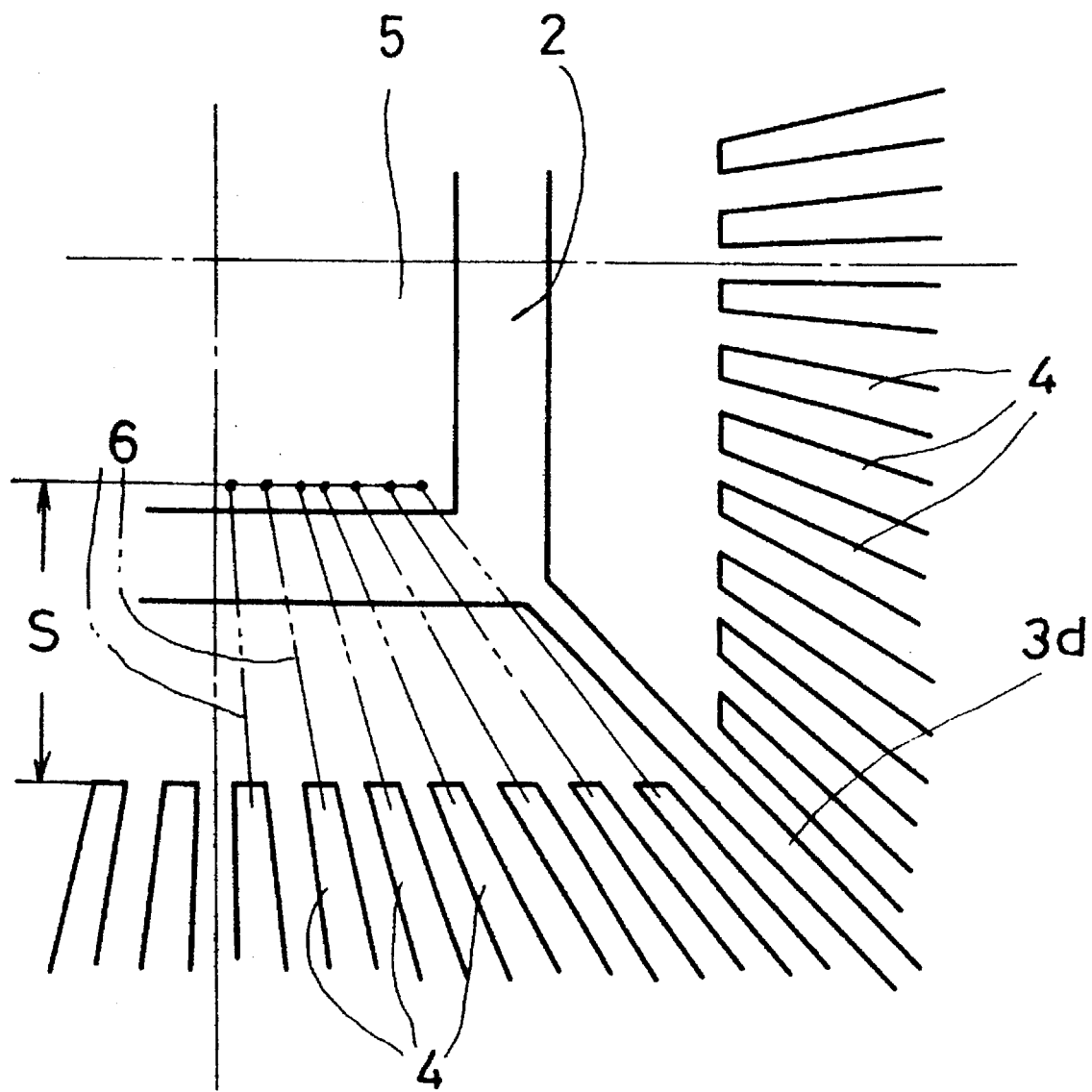
FIG. 4 is an enlarged fragmenary plan view showing a principal portion of the prior art leadframe.

Referring to FIGS. 1 and 2 of the accompanying drawings, there is illustrated only a region of a leadframe 11 corresponding to a single semiconductor device. In reality, however, the leadframe 11 has a sufficient length for making a plurality of such semiconductor devices.

The leadframe 11 is rode of a thin metal plate and has a square island 12 generally at the widthwise center of the leadframe. The leadframe 11 further comprises four integral bridging legs 13a–13d extending radially inward for integral connection to the respective four corners of the island 12, and a multiplicity of integral leads 14 extending radially inwardly toward but spaced from the island 12 between the respective bridging legs 13a–13d. Of course, the bridging legs 13a–13d may be connected to other four positions of the island 12 adjacent to the respective four corners thereof.

The island 12 is used for bonding a semiconductor chip 15 which has a multiplicity of connection pads (electrode pads) electrically connected to the resepctive leads 14 through metal wires 16. The semiconductor chip 15 together with the leads 14 and wires 16 is enclosed in a molded resin package 17. This package my be formed by using a mold which has a gate 18 located at one corner of the mold cavity for injecting a fluid resin material, as indicated by arrow A in FIG. 1.

The leads 14 are divided into eight groups by the respective bridging legs 13a–13d and the middle points between the respective bridging legs. As shown in FIG. 2, the leads 14 in each group have their respective tips arranged on a line 19 which is inclined relative to a corresponding side of the island 12 in a manner such that the line 19 becomes progressively farther from the corresponding side of the island as it extends from the bridging leg (13d in FIG. 2) to the relevent middle point. Thus, the lead-to-chip distance is smallest (represented by sign S1 in FIG. 2) at a position next to the bridging leg and largest (represented by sign S2 in FIG. 2) at the middle point. Preferably, the inclination angle of the line 19 my be 45 degrees for example.

According to the arrangement described above, the respective tips of the leads 14 in each group are arranged on the inclined line 19. Thus, even if the number of leads arranged between the respective bridging legs 13a–13d increases, the respective leads can be spaced from each other by a suitable pitch as required for enabling wire bonding while preventing unexpected shorting.

Further, it is also possible to greatly shorten the wires 16 near the respective bridging legs 13a–13d. Apparently, the thus shortened wires 16 near the respective bridging legs 13a–13d can be effectively prevented from being unexpectedly curved under a force component of the resin fluid pressure which acts transversely of the resin injecting direction A at the time of molding the resin package 17.

The preferred embodiment of the present invention being thus described, it is obvious that the same my be varied in many ways. For instance, the respective tips of the leads 14 need not be arranged on a straight line as long as the wires 16 can be rendered progressively shorter toward the respective bridging legs 13a–13d. Such variations are not to be regarded as a departure from the spirit and scope of the present invention, and all such variations as would be obvious to those skilled in the art are intended to be included within the scope of the following claims.

We claim:

1. A leadframe for making at least one semiconductor device comprising:

at least one island arranged centrally widthwise of the leadframe and having four corner portions;

four bridging legs radially extending from the respective corner portions of the island, the bridging legs being integral with the leadframe and island; and a multiplicity of leads radially extending toward but spaced from the island, the leads being integral with the leadframe;

wherein the leads have respective tips which are progressively closer to the island toward the respective bridging legs;

wherein the respective tips of the leads located between each bridging leg and a middle point of each two adjacent bridging legs are arranged on a straight line which is inclined relative to a corresponding side of the island; and wherein the straight line is inclined relative to the corresponding side of the island by 45 degrees.

2. A semiconductor device comprising:

a central island having four corner portions;

a semiconductor chip mounted on the island, the chip having connection points arranged along respective edges of the chip;

four bridging legs radially extending integrally from the respective corner portions of the island;

a multiplicity of leads radially extending toward but spaced from the island, the leads having respective tips electrically connected to the respective connection points of the semiconductor chip through respective wires; and a resin package enclosing the island, semiconductor chip, bridging legs, leads and wires;

wherein the wires are progressively shorter toward the respective bridging legs;

wherein the respective tips of the leads located between each bridging leg and a middle point of each two adjacent bridging legs are arranged on a straight line which is inclined relative to a corresponding side of the island; and wherein the straight line is inclined relative to the corresponding side of the island by 45 degrees.

* * * * *